(12) United States Patent
Kwon

(10) Patent No.: US 8,693,248 B2
(45) Date of Patent: Apr. 8, 2014

(54) NONVOLATILE DATA STORAGE DEVICES, PROGRAM METHODS THEREOF, AND MEMORY SYSTEMS INCLUDING THE SAME

(75) Inventor: Ohsuk Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 168 days.

(21) Appl. No.: 12/981,934

(22) Filed: Dec. 30, 2010

(65) Prior Publication Data

US 2011/0194366 A1 Aug. 11, 2011

(30) Foreign Application Priority Data

Feb. 11, 2010 (KR) ........................ 10-2010-0012908

(51) Int. Cl.
*G11C 11/34* (2006.01)
(52) U.S. Cl.
USPC ............ 365/185.11; 365/185.17; 365/185.18; 365/185.23; 365/185.27; 365/185.33
(58) Field of Classification Search
USPC ............. 365/185.11, 185.17, 185.18, 185.23, 365/185.27, 185.33
See application file for complete search history.

(56) References Cited

U.S. PATENT DOCUMENTS

| | | | |
|---|---|---|---|
| 6,295,227 B1 | 9/2001 | Sakui et al. | |
| 7,184,307 B2 * | 2/2007 | Lee | 365/185.11 |
| 7,577,059 B2 * | 8/2009 | Pyeon | 365/185.11 |
| 7,697,333 B2 * | 4/2010 | Isobe | 365/185.11 |
| 7,821,832 B2 * | 10/2010 | Hahn | 365/185.11 |
| 8,139,417 B2 * | 3/2012 | Kim et al. | 365/185.17 |

FOREIGN PATENT DOCUMENTS

| | | |
|---|---|---|
| JP | 2000-222895 | 8/2000 |
| JP | 2001-291392 | 10/2001 |
| KR | 1020000035673 A | 6/2000 |
| KR | 1020090044903 A | 5/2009 |

* cited by examiner

*Primary Examiner* — Trong Phan
(74) *Attorney, Agent, or Firm* — Myers Bigel Sibley & Sajovec, PA

(57) ABSTRACT

Provided are methods of programming a nonvolatile data storage device including memory blocks sharing a block word line. The methods may include selecting the memory blocks, and the selected memory blocks may include a first memory block that is to be programmed and a second memory block that is to be program-inhibited. The methods may also include applying a program voltage to a selected word line of the first memory block. The methods may further include applying a bipolar prohibition voltage to word lines of the second memory block.

20 Claims, 10 Drawing Sheets

Fig. 6

| BLK1 | GS1 | VSS |
|---|---|---|
| | S1_1 | Vpass |
| | S1_2 | Vpgm |
| | S1_3~S1_n | Vpass |
| | SS1 | VDD |
| BLK2 | GSL2 | Va |
| | S2_1~S2_n | Va |
| | SS2 | Va |

NONVOLATILE DATA STORAGE DEVICES, PROGRAM METHODS THEREOF, AND MEMORY SYSTEMS INCLUDING THE SAME

CROSS-REFERENCE TO RELATED APPLICATIONS

This U.S. non-provisional patent application claims priority under 35 U.S.C. §119 to Korean Patent Application No. 10-2010-0012908, filed on Feb. 11, 2010, the disclosure of which is hereby incorporated by reference in its entirety.

BACKGROUND

The present disclosure herein relates to semiconductor memory devices, and more particularly, to methods of programming nonvolatile data storage devices.

Semiconductor memory devices may be implemented using semiconductors such as silicon (Si), germanium (Ge), gallium arsenide (GaAs), and indium phosphide (InP). Semiconductor memory devices may be classified into volatile data storage devices and nonvolatile data storage devices.

Volatile data storage devices lose data stored therein when power supply thereto is interrupted. Examples of volatile data storage devices include static random access memory (SRAM) devices, dynamic random access memory (DRAM) devices, and synchronous dynamic random access memory (SDRAM) devices. Nonvolatile data storage devices retain data stored therein even when power supply thereto is interrupted. Examples of nonvolatile data storage devices include read-only memory (ROM) devices, programmable read-only memory (PROM) devices, erasable programmable read-only memory (EPROM) devices, electrically erasable programmable read-only memory (EEPROM) devices, flash memory devices, phase-change random access memory (PRAM) devices, magnetic random access memory (MRAM) devices, resistive random access memory (RRAM) devices, and ferroelectric random access memory (FRAM) devices. Flash memory devices may be classified into NOR flash memory devices and NAND flash memory devices.

SUMMARY

The present disclosure provides nonvolatile data storage devices that may reduce/prevent a bipolar phenomenon between pass transistors connected to memory blocks of a memory cell array.

In some embodiments, methods of programming a nonvolatile data storage device including memory blocks sharing a block word line include selecting the memory blocks, the selected memory blocks including a first memory block that is to be programmed and a second memory block that is to be program-inhibited. In some embodiments, the methods also include applying a program voltage to a selected word line of the first memory block. In some embodiments, the methods further include applying a bipolar prohibition voltage to word lines of the second memory block.

In some embodiments, selecting the memory blocks includes enabling pass transistors connected to the selected memory blocks.

In other embodiments, applying the program voltage to the selected word line includes applying the program voltage through one of the enabled pass transistors to the selected word line.

In further embodiments, applying the bipolar prohibition voltage to the word lines of the second memory block includes applying the bipolar prohibition voltage through the enabled pass transistors to the word lines of the second memory block.

In still further embodiments, applying the bipolar prohibition voltage to the word lines of the second memory block includes applying a same bipolar prohibition voltage to each of the word lines of the second memory block.

In still further embodiments, applying the bipolar prohibition voltage to the word lines of the second memory block includes applying different bipolar prohibition voltages to different ones of the word lines of the second memory block.

In still further embodiments, applying the bipolar prohibition voltage to the word lines of the second memory block includes applying different bipolar prohibition voltages to different groups of the word lines of the second memory block.

In still further embodiments, the bipolar prohibition voltage is a positive voltage.

In still further embodiments, the bipolar prohibition voltage is higher than a voltage of a substrate of the nonvolatile data storage device.

In still further embodiments, the bipolar prohibition voltage is higher than a voltage of a substrate of the nonvolatile data storage device that varies during a program operation.

In still further embodiments, the method includes applying the bipolar prohibition voltage to a ground select line and a string select line of the second memory block.

In still further embodiments, a block decoder selects the first and second memory blocks in response to a decoded block address.

In some embodiments, nonvolatile data storage devices include first and second memory blocks sharing a block word line, the first memory block configured to be programmed and the second memory block configured to be program-inhibited. In some embodiments, the devices also include a block decoder connected to the block word line and configured to select the first and second memory blocks. In some embodiments, the devices further include a first driver configured to apply a program voltage to a selected word line among a plurality of word lines of the first memory block. In some embodiments, the devices also include a second driver configured to apply a bipolar prohibition voltage to word lines of the second memory block.

In some embodiments, the nonvolatile data storage devices further include first pass transistors, each of which is connected to a respective one of the plurality of word lines of the first memory block, and second pass transistors, each of which is connected to a respective one of the word lines of the second memory block. In some embodiments, the block decoder is configured to enable the first and second pass transistors to select the first and second pass transistors.

In some embodiments, the first driver is configured to apply the program voltage to the selected word line through a pass transistor among the enabled first pass transistors.

In further embodiments, the second driver is configured to apply the bipolar prohibition voltage to the word lines of the second memory block through the enabled second pass transistors.

In still further embodiments, the second driver is configured to apply the bipolar prohibition voltage to a ground select line and a string select line of the second memory block.

In some embodiments, memory systems including the nonvolatile data storage device further include a controller configured to control the nonvolatile data storage device.

In some embodiments, a method of operating a nonvolatile data storage device including memory blocks sharing a block word line includes selecting the memory blocks to provide a first memory block that is to be programmed and a second memory block that is to be program-inhibited. In some embodiments, the method also includes enabling pass transistors connected to the first and second memory blocks to provide enabled pass transistors. In some embodiments, the method further includes applying a program voltage to a selected word line coupled to the first memory block. In some embodiments, the method also includes applying a bipolar prohibition voltage through the enabled pass transistors to word lines coupled to the second memory block.

In further embodiments, applying the program voltage to the selected word line includes applying the program voltage through at least one of the enabled pass transistors to the selected word line to form a bipolar junction between the at least one of the enabled pass transistors through which the program voltage is applied and an immediately adjacent one of the enabled pass transistors of the second memory block.

The methods of programming the nonvolatile data storage device according to some embodiments can reduce/prevent a bipolar phenomenon between the pass transistors of a transistor circuit, thus making it possible to improve the data reliability of the nonvolatile data storage device.

BRIEF DESCRIPTION OF THE DRAWINGS

The foregoing and other features and advantages of the disclosure will become more apparent by describing in detail exemplary embodiments thereof with reference to the following drawings:

FIG. 6 is a table illustrating voltage conditions applied to the pass transistors of the first and second pass transistor circuits of FIG. 3 in a program operation according to some embodiments;

DETAILED DESCRIPTION OF EXAMPLE EMBODIMENTS

Figure 1:
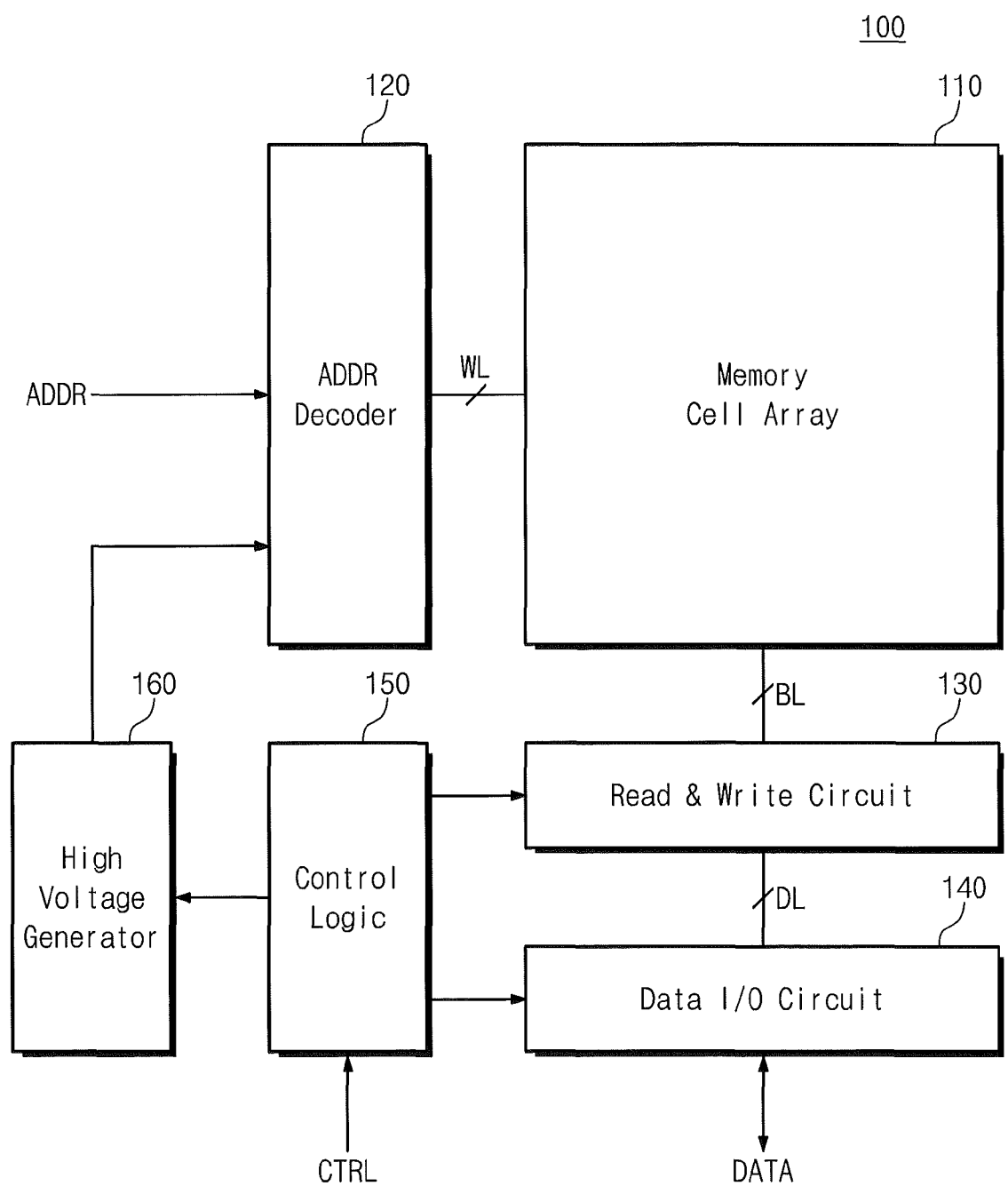
FIG. 1 is a block diagram of a nonvolatile data storage device according to some embodiments.

Example embodiments will be described below in more detail with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete, and will fully convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a nonvolatile data storage device 100 according to some embodiments.

Referring to FIG. 1, a nonvolatile data storage device 100 according to some embodiments may include a memory cell array 110, an address decoder 120, a read/write circuit 130, a data input/output (I/O) circuit 140, a control logic 150, and a high voltage generator 160.

The memory cell array 110 is connected through word lines WL to the address decoder 120, and is connected through bit lines BL to the read/write circuit 130. The memory cell array 110 includes a plurality of memory cells. The memory cells are connected to the word lines WL and the bit lines BL. For example, rows of the memory cells may be connected to the word lines WL, and columns of the memory cells may be connected to the bit lines BL. The memory cell array 110 includes a plurality of memory blocks. Each of the memory blocks includes a plurality of memory cells. For example, the memory cell array 110 may be configured to store one or more bits per cell.

The address decoder 120 is connected through the word lines WL to the memory cell array 110. The address decoder 120 operates in response to the control of the control logic 150. The address decoder 120 receives an address ADDR from an external device.

The address decoder 120 is configured to decode a block address among the received addresses ADDR. The address decoder 120 may use the decoded block address to select one or more memory blocks. For example, the address decoder 120 may select two memory blocks on the basis of the decoded block address.

The address decoder 120 is configured to decode a row address among the received addresses ADDR. The address decoder 120 uses the decoded row address to select the word lines WL. The address decoder 120 provides a voltage, received from the high voltage generator 160, to the selected word lines WL. For example, in a program operation, a program voltage Vpgm is applied to the selected word line.

The address decoder 120 is configured to decode a column address among the received addresses ADDR. The decoded column address is transferred to the read/write circuit 130. For example, the address decoder 120 may include a block decoder, a row decoder, a column decoder, and an address buffer.

The read/write circuit 130 is connected through the bit lines BL to the memory cell array 110, and is connected through data lines DL to the data I/O circuit 140. The read/write circuit 130 operates in response to the control of the control logic 150. The read/write circuit 130 is configured to receive the decoded column address from the address decoder 120. The read/write circuit 130 uses the decoded column address to select the bit lines BL.

For example, the read/write circuit 130 receives data from the data I/O circuit 140 and writes the received data in the memory cell array 110. The read/write circuit 130 reads data from the memory cell array 110 and transfers the read data to the data I/O circuit 140. Also, the read/write circuit 130 reads data from a first storage region of the memory cell array 110 and copyback-programs the read data in a second storage region of the memory cell array 110.

For example, the read/write circuit 130 may include a page buffer (or a page register) and a column selection circuit. As another example, the read/write circuit 130 may include a sense amplifier, a write driver, and a column selection circuit.

The data I/O circuit 140 is connected through the data lines DL to the read/write circuit 130. The data I/O circuit 140 operates in response to the control of the control logic 150. The data I/O circuit 140 is configured to exchange data (DATA) with an external device. The data I/O circuit 140 is configured to transfer data (DATA), received from the external device, through the data lines DL to the read/write circuit 130. The data I/O circuit 140 is further configured to output data (DATA), received through the data lines DL from the read/write circuit 130, to the external device. For example, the data I/O circuit 140 may include a data buffer.

The control logic 150 is connected to the address decoder 120, the read/write circuit 130, the data I/O circuit 140, and the high voltage generator 160. For example, the control logic 150 may be directly connected to the read/write circuit 130 and the data I/O circuit 140 and may be connected to the address decoder 120 through the high voltage generator 160. The control logic 150 is configured to control an overall operation of the nonvolatile data storage device 100. The control logic 150 operates in response to a control signal CTRL received from an external device.

The high voltage generator 160 is connected to the address decoder 120. The high voltage generator 160 operates in response to the control of the control logic 150. The high voltage generator 160 provides a high voltage to the address decoder 120. For example, the high voltage generator 160 receives a power voltage, amplifies the received power voltage, and divides the amplified voltage to generate various high voltages. The high voltage generator 160 may provide, for example, a program voltage Vpgm, a pass voltage Vpass, and a read voltage Vread to the address decoder 120.

The nonvolatile data storage device 100 may include at least one of flash memories, EEPROMs, PRAMs, MRAMs, FRAMs, and RRAMs.

Figure 2:
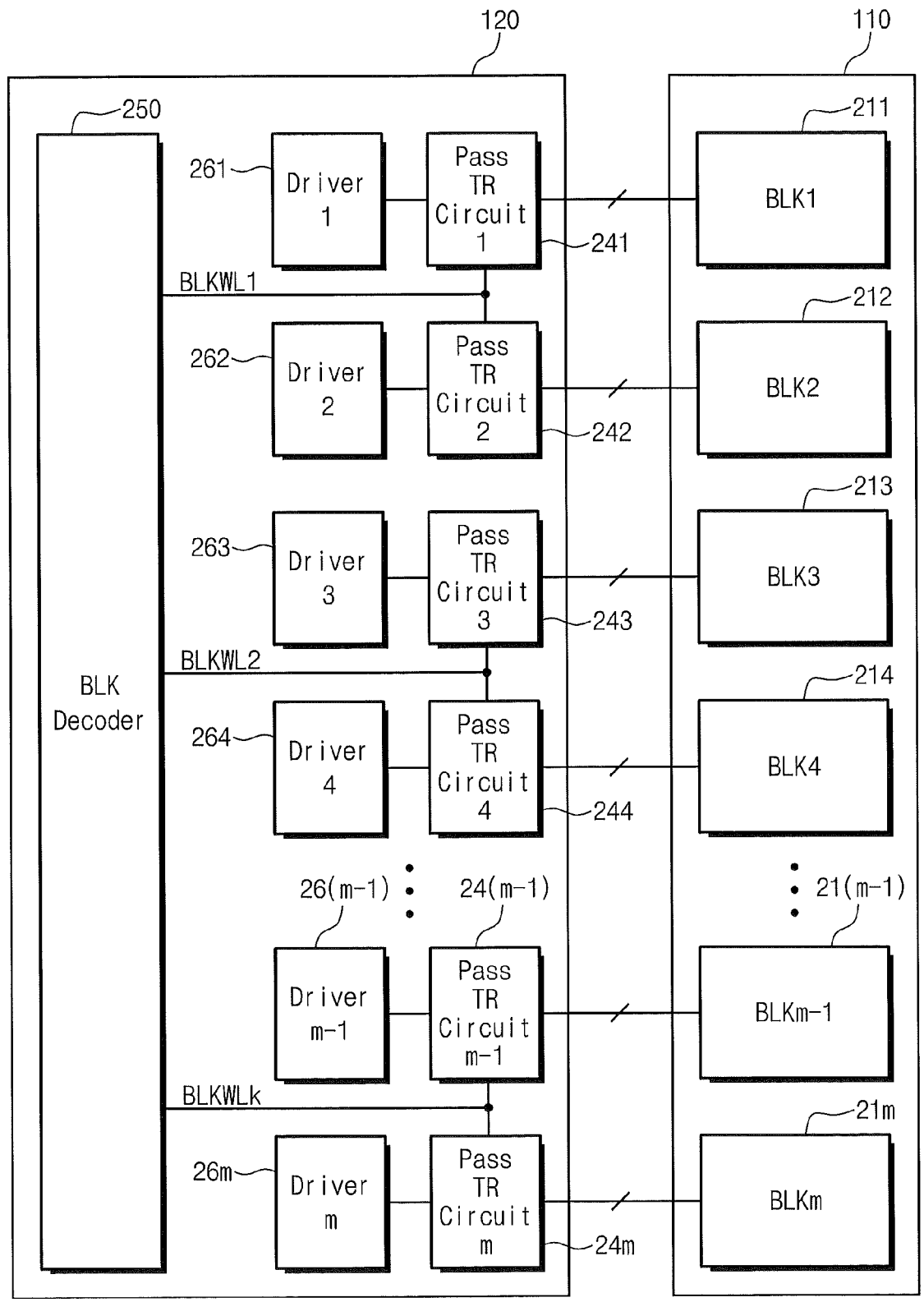
FIG. 2 is a block diagram illustrating portions of an address decoder and a memory cell array of FIG. 1 according to some embodiments.

FIG. 2 is a block diagram illustrating portions of the address decoder 120 and the memory cell array 110 of FIG. 1 according to some embodiments.

Referring to FIG. 2, the address decoder 120 includes a plurality of pass transistor circuits 241~24m (illustrated as Pass TR Circuit 1-Pass TR Circuit m, respectively), a block decoder 250, and a plurality of drivers 261~26m (illustrated as Driver 1 -Driver m, respectively).

The pass transistor circuits 241~24m are connected to the block decoder 250 through block word lines BLKWL1~BLKWLk. The pass transistor circuits 241~24m are configured to share a block word line. For example, two pass transistor circuits can share a block word line. As an example, the first pass transistor circuit 241 and the second pass transistor circuit 242 are configured to share the first block word line BLKWL1 and are connected to the block decoder 250 through the first block word line BLKWL1. In response to a block address, a block selection signal may be provided from the block decoder 250 through the block word lines BLKWL1~BLKWLk to the pass transistor circuits 241~24m.

The pass transistor circuits 241~24m are connected to the drivers 261~26m. The pass transistor circuits 241~24m are further connected to memory blocks 211~21m. As an example, the first pass transistor circuit 241 is connected to the first memory block BLK1 211 and the first driver 261.

The block decoder 250 is connected to the pass transistor circuits 241~24m. The block decoder 250 is configured to decode a block address among the received addresses ADDR. The block decoder 250 uses the decoded block address to select the pass transistor circuits 241~24m. The selected pass transistor circuits are turned on to electrically connect the memory blocks 211~21m and the drivers 261~26m. For example, when a program operation is performed on the first memory block 211, the block decoder 250 uses the decoded block address to select the first and second pass transistor circuits 241 and 242. The selected first and second pass transistor circuits 241 and 242 are turned on to electrically connect the first and second drivers 261 and 262 and the first and second memory blocks 211 and 212.

Figure 3:
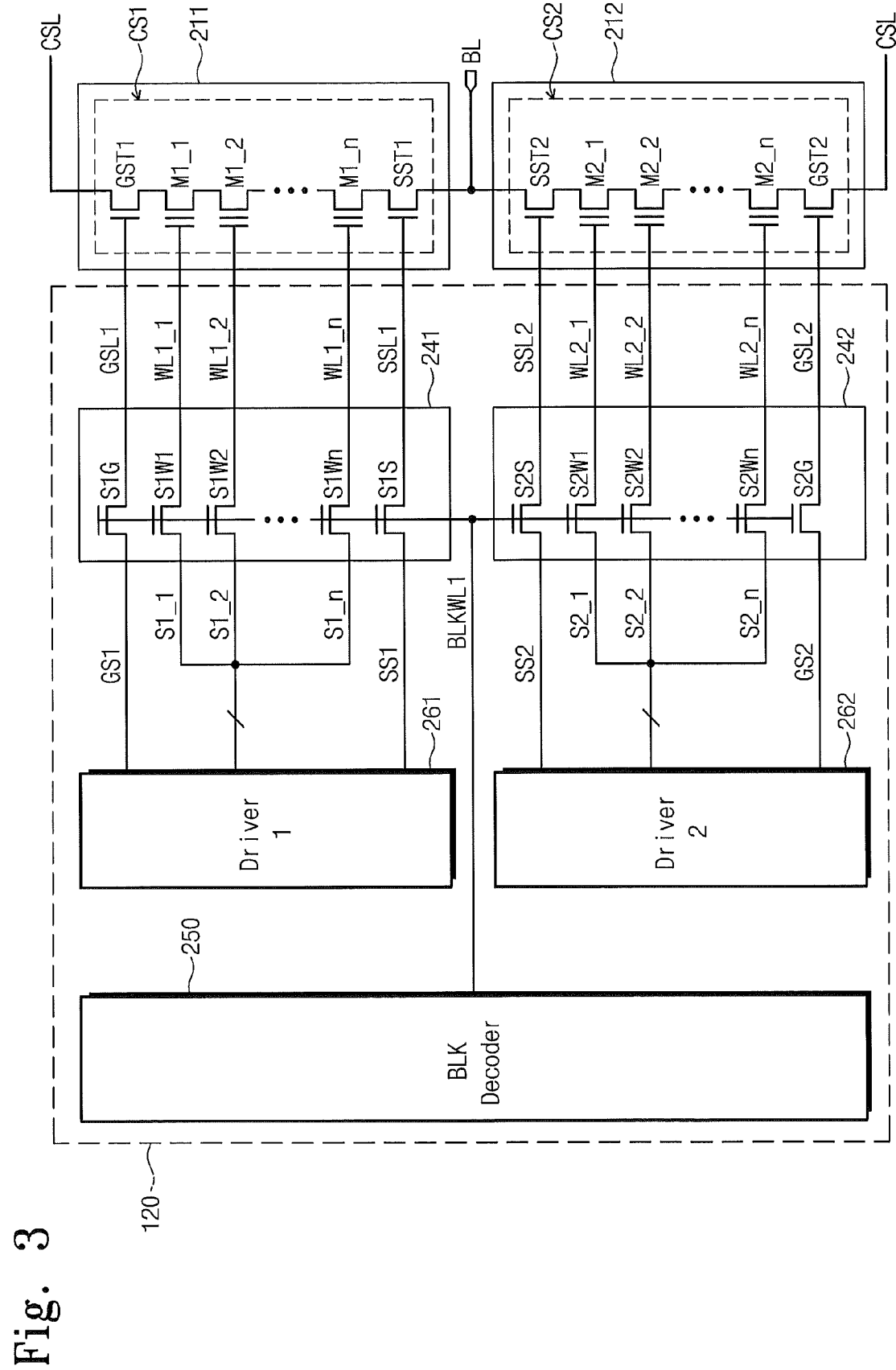
FIG. 3 is a block diagram illustrating portions of memory blocks and an address decoder of FIG. 2 according to some embodiments.

FIG. 3 is a block diagram illustrating some of the memory blocks 211~21m and the address decoder 120 of FIG. 2 according to some embodiments.

By way of example, FIG. 3 illustrates the first and second memory blocks 211 and 212, the first and second pass transistor circuits 241 and 242, the block decoder 250, and the first and second drivers 261 and 262.

The first memory block 211 includes a cell string CS1. The cell string CS1 includes a string select transistor SST1, a ground select transistor GST1, and memory cells $M1\_1$~$M1\_n$. The string select transistor SST1 is connected to a bit line BL. The ground select transistor GST1 is connected to a common source line CSL. The memory cells $M1\_1$~$M1\_n$ are connected between the string select transistor SST1 and the ground select transistor GST1.

The second memory block 212 includes a cell string CS2. The cell string CS2 includes a string select transistor SST2, a ground select transistor GST2, and memory cells $M2\_1$~$M2\_n$. The second memory block 212 may be configured in the same way as the first memory block 211.

The first memory block 211 and the second memory block 212 may be configured to share the bit line BL. For example, FIG. 3 illustrates that the first/second memory block 211/212 includes one cell string CS1/CS2 connected to one bit line BL. However, each of the first/second memory blocks 211/212 may include a plurality of cell strings connected respectively to a plurality of bit lines.

FIG. 3 illustrates that one bit line is shared by two memory blocks. However, one bit line may be shared by at least three memory blocks.

The first and second pass transistor circuits 241 and 242 include a plurality of pass transistors S1G, S1S, S1W1~S1Wn, S2G, S2S, and S2W1~S2Wn. For example, the pass transistors S1G, S1S, S1W1~S1Wn, S2G, S2S, and S2W1~S2Wn of the first and second pass transistor circuits 241 and 242 may be configured using NMOS transistors. The gates of the NMOS transistors may be connected to the block decoder 250 through the first block word line BLKWL1.

The first pass transistor circuit 241 connected to the first memory block 211 and the second pass transistor circuit 242 connected to the second memory block 212 are configured to share the first block word line BLKWL1. Thus, when a program operation is performed on the first memory block 211 or when a program operation is performed on the second memory block 212, the pass transistors S1G, S1S, S1W1~S1Wn, S2G, S2S, and S2W1~S2Wn of the first and second pass transistor circuits 241 and 242 are turned on.

FIG. 3 illustrates that two memory blocks 211 and 212 share the first block word line BLKWL1. However, additionally/alternatively, other memory blocks may share the first block word line BLKWL1.

When the first block word line BLKWL1 is selected according to the decoded block address, the pass transistors S1G, S1S, S1W1~S1Wn, S2G, S2S, and S2W1~S2Wn of the first and second pass transistor circuits 241 and 242 are turned on.

The turned-on first pass transistor circuit 241 connects a first string select signal line SS1, a first ground select signal line GS1, and first word line drive signal lines S1_1~S1_n to the first string select line SSL1, the first ground select line GSL1, and the first word lines WL1_1~WL1_n of the first memory block 211.

The turned-on second pass transistor circuit 242 connects a second string select signal line SS2, a second ground select signal line GS2, and second word line drive signal lines S2_1~S2_n to the second string select line SSL2, the second ground select line GSL2, and the second word lines WL2_1~WL2_n of the second memory block 212.

The block decoder 250 of FIG. 3 may operate in the same way as the block decoder 250 of FIG. 2.

In a program operation of the first memory block 211 or the second memory block 212, the first and second drivers 261 and 262 (illustrated as Driver 1 and Driver 2, respectively) apply a power voltage VDD or a bipolar prohibition voltage Va to the first string select signal line SS1 of the first memory block 211 and the second string select signal line SS2 of the second memory block 212.

In a program operation of the first memory block 211 or the second memory block 212, the first and second drivers 261 and 262 apply a ground voltage VSS or a bipolar prohibition voltage Va to the first ground select signal line GS1 of the first memory block 211 and the second ground select signal line GS2 of the second memory block 212.

In a program operation of the first memory block 211 or the second memory block 212, the first and second drivers 261 and 262 apply a program voltage Vpgm, a pass voltage Vpass, or a bipolar prohibition voltage Va to the first and second word line drive signal lines S1_1~S1_n and S2_1~S2_n of the first memory block 211 or the second memory block 212, respectively, in response to decoded row address signals (not illustrated) and control signals (not illustrated).

Specifically, the program voltage Vpgm is applied to a selected word line of the memory block to be programmed. The pass voltage Vpass is applied to an unselected word line of the memory block to be programmed. The bipolar prohibition voltage Va is applied to the memory blocks to be program-inhibited.

Figure 4:
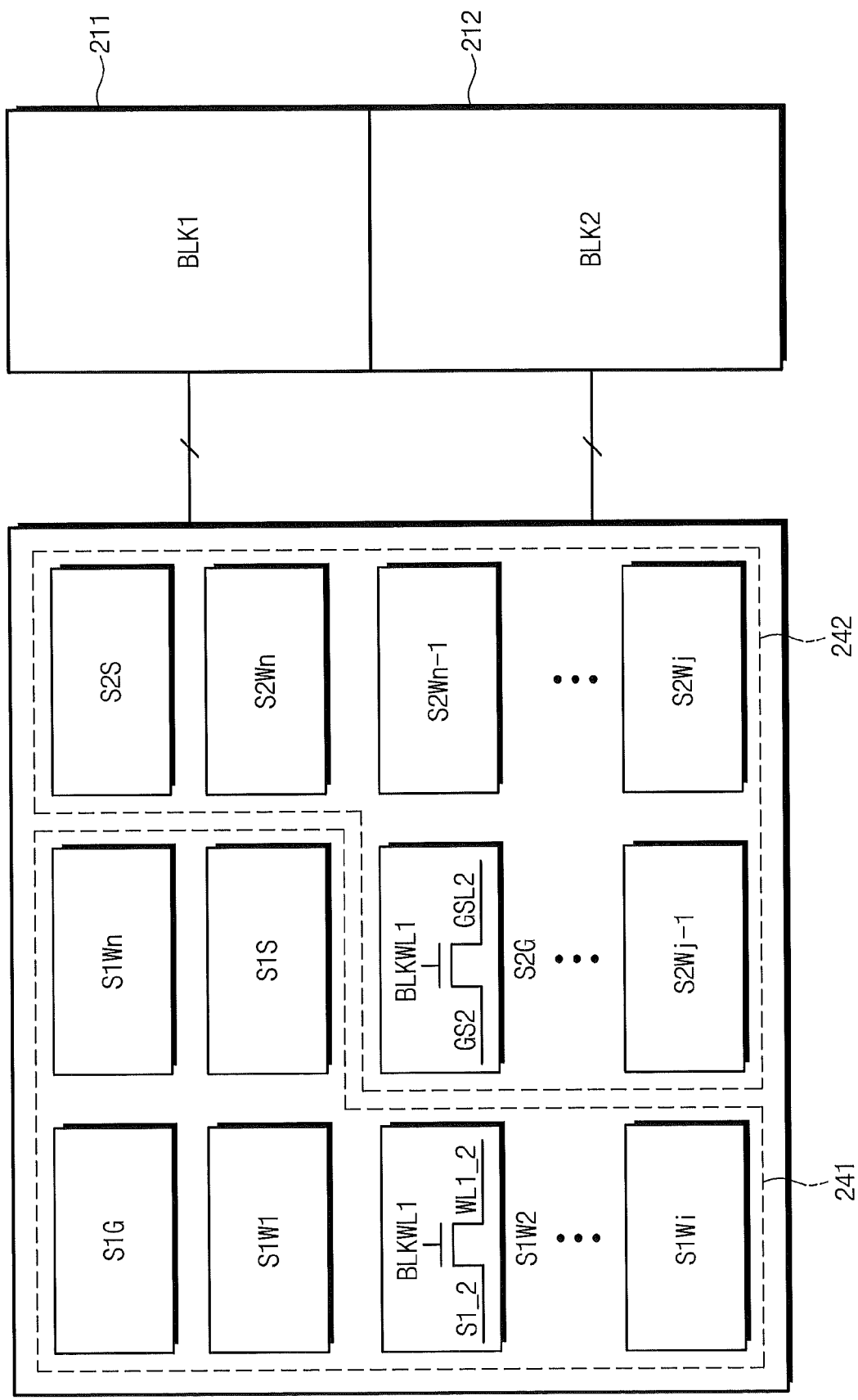
FIG. 4 is a block diagram illustrating an arrangement of pass transistors of first and second pass transistor circuits of FIG. 3 according to some embodiments.

FIG. 4 is a block diagram illustrating an arrangement of the pass transistors S1G, S1S, S1W1~S1Wn, S2G, S2S, and S2W1~S2Wn of the first and second pass transistor circuits 241 and 242 of FIG. 3 according to some embodiments.

Although not illustrated in FIG. 3, a first pass transistor S1Wi may be included with the first pass transistors S1G, S1S, and S1W1~S1Wn. Although not illustrated in FIG. 3, a second pass transistor S2Wj and a second pass transistor S2Wj-1 may be included with the second pass transistors S2G, S2S, and S2W1~S2Wn.

In order to improve the integration density, the pass transistors S1G, S1S, S1W1~S1Wn, S2G, S2S, and S2W1~S2Wn of the first and second pass transistor circuits 241 and 242 may be arranged independently of the direction of the bit lines of the first memory block 211 and the second memory block 212. For example, the pass transistors S1G, S1S, S1W1~S1Wn, S2G, S2S, and S2W1~S2Wn of the first and second pass transistor circuits 241 and 242 may be arranged in a matrix configuration, as illustrated in FIG. 4.

By way of example, FIG. 4 illustrates that the first pass transistor S1W2 connects the first word line drive signal line S1_2 and the first word line WL1_2. Also, the second pass transistor S2G connects the second ground select signal line GS2 and the second ground select line GSL2.

FIG. 4 illustrates the structure of the first pass transistor S1W2 and the second pass transistor S2G. However, each of the other pass transistors of the first and second pass transistor circuits 241 and 242 may be configured as described with reference to FIG. 3. That is, the gates of the first and second pass transistors S1G, S1S, S1W1~S1Wn, S2G, S2S, and S2W1~S2Wn are connected to the first block word line BLKWL1.

The first pass transistors S1G, S1S, and S1W1~S1Wn connect the first string select signal line SS1, the first ground select signal line GS1, and the first word line drive signal lines S1_1~S1_n, respectively, to the first string select line SSL1, the first ground select line GSL1, and the first word lines WL1_1~WL1_n.

The second pass transistors S2G, S2S, and S2W1~S2Wn connect the second string select signal line SS2, the second ground select signal line GS2, and the second word line drive signal lines S2_1~S2_n, respectively, to the second string select line SSL2, the second ground select line GSL2, and the second word lines WL2_1~WL2_n.

Referring to FIG. 4, the pass transistors S1S, S1G, and S1W1~S1Wn of the first pass transistor circuit 241 may be adjacent the pass transistors S2S, S2G, and S2W1~S2Wn of the second pass transistor circuit 242. For example, the first pass transistor S1Wn of the first pass transistor circuit 241 is adjacent the second pass transistor S2S of the second pass transistor circuit 242. Also, the first pass transistor S1Wi of the first pass transistor circuit 241 is adjacent the second pass transistor S2Wj-1 of the second pass transistor circuit 242. FIG. 4 illustrates an example of the arrangement of the pass transistors S1G, S1S, S1W1~S1Wn, S2G, S2S, and S2W1~S2Wn. Thus, the adjacent first/second pass transistors S1S, S1G, and S1W1~S1Wn/S2S, S2G, and S2W1~S2Wn may include more than those illustrated in FIG. 4.

Meanwhile, if one of the pass transistors S1S, S1G, and S1W1~S1Wn of the first pass transistor circuit 241 is adjacent one of the pass transistors S2S, S2G, and S2W1~S2Wn of the second pass transistor circuit 242, an NPN junction may be formed.

Specifically, when a program operation is performed on the first memory block 211, a program voltage Vpgm is applied to the pass transistor connected to a selected word line. If one of the pass transistors S1S, S1G, and S1W1~S1Wn connected to the selected word line is adjacent the second pass transistors S2S, S2G, and S2W1~S2Wn of the second pass transistor circuit 242, a bipolar phenomenon may be generated due to an NPN junction.

Figure 5:
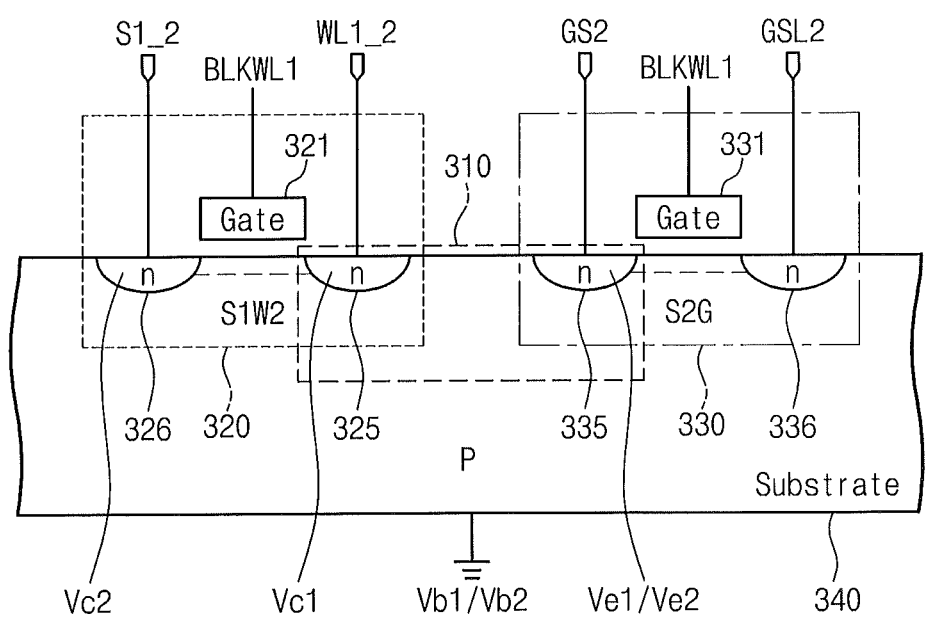
FIG. 5 is a sectional view of a first pass transistor and a second pass transistor of FIGS. 3 and 4 according to some embodiments.

FIG. 5 is a sectional view of the first pass transistor S1W2 and the second pass transistor S2G of FIGS. 3 and 4 according to some embodiments.

By way of example, it is assumed that the first pass transistor S1W2 320 is connected to the first word line WL1_2 of the first memory block 211 to be programmed and the second pass transistor S2G 330 is connected to the second ground selection line GSL2 of the second memory block 212 to be program-inhibited.

As described with reference to FIG. 3, the first pass transistor circuit 241 connected to the first memory block 211 shares the block word line BLKWL1 with the second pass transistor circuit 242 connected to the second memory block 212. That is, a gate 321 of the first pass transistor S1W2 and a gate 331 of the second pass transistor S2G are connected to the block word line BLKWL1. Thus, when a program operation is performed on the first memory block 211, the first pass transistor S1W2 and the second pass transistor S2G are turned on.

In a program operation of the first word line WL1_2, the program voltage Vpgm is applied to the first word line drive signal line S1_2. Also, the ground voltage VSS is applied to a substrate 340.

An n well 325 connected to the first word line WL1_2, the substrate 340, and an n well 335 connected to the second ground select signal line GS2 may form an NPN junction 310. For example, the n well 325 connected to the first word line WL1_2 may operate as a collector region, the substrate 340 may operate as a base region, and the n well 335 connected to the second ground select signal line GS2 may operate as an emitter region. The NPN junction 310 may operate as a bipolar junction transistor.

When the ground voltage VSS is applied to the second ground select signal line GS2, the voltage of the second ground select line GSL2 is the ground voltage VSS. The voltage of an n well 326 connected to the first word line drive signal line S1_2 is the program voltage Vpgm. Thus, a high-voltage program voltage V_pgm (hereinafter referred to as a collector voltage Vc1) is applied to the n well 325 connected to the first word line WL1_2. The voltage (hereinafter referred to as a base voltage Vb1) of the substrate 340 is the ground voltage VSS, and the voltage (hereinafter referred to as an emitter voltage Ve1) of the n well 335 connected to the second ground select signal line GS2 is the ground voltage VSS. Thus, the emitter voltage Ve1 of the n well 335 is not lower than the base voltage Vb1 of the substrate 340 and the forward bias condition may not be satisfied. Also, an n well 336 may be connected to the second ground select signal line GSL2.

However, when the difference between the collector Vc1 of the n well 325 and the emitter voltage Ve1 of the n well 335 is large, electrons of the n well 325 leak to the substrate 340. In this case, the base voltage Vb1 of the substrate 340 increases in the NPN junction region 310, the forward bias condition can be satisfied.

That is, the collector voltage Vc1 is higher than the increased base voltage Vb1 of the substrate 340, and the increased base voltage Vb1 of the substrate 340 is higher than the emitter voltage Ve1. Thus, a current flow may occur between the n well 325 and the n well 335. Hereinafter, this will be referred to as a bipolar phenomenon.

In order to reduce/prevent the bipolar phenomenon, the nonvolatile data storage device 100 according to some embodiments applies a bipolar prohibition voltage to a program-inhibited memory block connected to pass transistors with a turn-on state.

By way of example, when a bipolar prohibition voltage Va is applied to the second ground select signal line GS2, the voltage of the n well 335 is the bipolar prohibition voltage Va. The bipolar prohibition voltage Va may be a positive voltage. The bipolar prohibition voltage Va may be set higher than an increased voltage Vb2 of the substrate 340.

In addition, referring to FIG. 4, the same bipolar prohibition voltage Va may be applied to the pass transistors S2G, S2S, and S2W1~S2Wn of the second pass transistor circuit 242. Different bipolar prohibition voltages may be applied to the respective pass transistors S2G, S2S, and S2W1~S2Wn of the second pass transistor circuit 242. Also, the pass transistors S2G, S2S, and S2W1~S2Wn of the second pass transistor circuit 242 may be divided into a plurality of groups and different bipolar prohibition voltages may be applied on a group-by-group basis.

When a program operation is performed on the first memory block 211, the voltage (hereinafter referred to as a collector voltage Vc2) of the n well 326 receiving the first word line drive signal line S1_2 is a high-voltage program voltage Vpgm. Thus, the voltage of the n well 325 may be a high-voltage program voltage V_pgm. The substrate 340 has a voltage (hereinafter referred to as a base voltage Vb2) lower than the bipolar prohibition voltage Va. The voltage (hereinafter referred to as an emitter voltage Ve2) of the n well 335 is the bipolar prohibition voltage Va. Thus, the collector voltage Vc2 is higher than the base voltage Vb2 of the substrate 340, and the base voltage Vb2 of the substrate 340 is lower than the emitter voltage Ve2. Thus, when the bipolar prohibition voltage Va is used in the NPN junction region 310, the forward bias condition may not be satisfied.

FIG. 5 illustrates the first pass transistor S1W2 and the second pass transistor S2G. However, when the first pass transistors S1G, S1S, and S1W1~S1Wn are adjacent the second pass transistors S2G, S2S, and S2W1~S2Wn, the bipolar prohibition voltage may be applied as described with reference to FIG. 3.

Referring back to FIG. 3, when a program operation is performed on the first memory block 211, the first driver 261 turns on the string select transistor SST1 to select the first memory block 211. As an example, in a program operation of the first memory block 211, the first driver 261 applies the power voltage VDD to the string select signal line SS1 to select the first memory block 211. When a program operation is performed on the second memory block 212, the first driver 261 applies the bipolar prohibition voltage Va to the string select signal line SS1 of the first pass transistor circuit 241.

When a program operation is performed on the first memory block 211, the first driver 261 turns off the ground select transistor GST1. As an example, when a program operation is performed on the first memory block 211, the first driver 261 applies the ground voltage VSS to the ground select signal line GS1 of the first pass transistor circuit 241.

When a program operation is performed on the second memory block 212, the first driver 261 applies the bipolar prohibition voltage Va to the ground select signal line GS1 of the first pass transistor circuit 241.

When a program operation is performed on the first memory block 211, the first driver 261 applies the program voltage Vpgm or the pass voltage Vpass in response to decoded row address signals (not illustrated) and control signals (not illustrated) to the word line drive signal lines S1_1~S1_n. When a program operation is performed on the second memory block 212, the first driver 261 applies the bipolar prohibition voltage Va to the word line drive signal lines S1_1~S1_n.

When a program operation is performed on the first memory block 211 or the second memory block 212, the second driver 262 may operate in the same way as the first driver 261.

FIG. 6 is a table illustrating voltage conditions applied to the pass transistors S1G, S1S, S1W1~S1Wn, S2G, S2S, and S2W1~S2Wn of the first and second pass transistor circuits 241 and 242 of FIG. 3 in a program operation according to some embodiments.

FIG. 6 illustrates voltages by way of the example of programming the word line WL1_2 of the first memory block 211.

Referring to FIGS. 3 and 6, in the first memory block 211, the ground voltage VSS is applied to the first ground select signal line GS1. The power voltage VDD is applied to the first string select signal line SS1. The program voltage Vpgm (e.g., about 20V) is applied to the word line drive signal line S1_2 connected to the selected word line WL1_2. The pass voltage Vpass is applied to the word line drive signal lines S1_1 and S1_3~S1_n connected to the unselected word lines WL1_1 and WL1_3~WL_n, respectively.

As described with reference to FIG. 4, the pass transistors S2S, S2G, and S2W1~S2Wn of the second pass transistor circuit 242 may be arranged adjacent the first pass transistor S1W2 connected to the word line drive signal line S1_2 to which the program voltage Vpgm is applied. Thus, a bipolar phenomenon may occur.

Therefore, in the program-inhibited second memory block 212, the bipolar prohibition voltage Va is applied to the ground select signal line GS2, the string select signal line SS2, and the word line drive signal lines S2_1~S2_n.

The distance between the respective pass transistors may vary according to the arrangement of the pass transistors S1G, S1S, S1W1~S1Wn, S2G, S2S, and S2W1~S2Wn of the first and second pass transistor circuits 241 and 242. Also, there may be a process error in the pass transistors S1G, S1S, S1W1~S1Wn, S2G, S2S, and 52W1~S2Wn of the first and second pass transistor circuits 241 and 242.

Thus, in some embodiments, the same bipolar prohibition voltage Va may not be applied to each of the ground select signal line GS2, the string select signal line SS2, and the word line drive signal lines S2_1~S2_n. For example, different bipolar prohibition voltages may be applied respectively to the ground select signal line GS2, the string select signal line SS2, and the word line drive signal lines S2_1~S2_n. Alternatively, the ground select signal line GS2, the string select signal line SS2, and the word line drive signal lines S2_1~S2_n may be divided into a plurality of groups and different bipolar prohibition voltages may be applied on a group-by-group basis.

For example, the string select signal line SS2 may be driven by the bipolar prohibition voltage Va, the word line drive signal lines S2_5~S2_n may be driven by a second bipolar prohibition voltage, the word line drive signal lines S2_1~S2—4 may be driven by a third bipolar prohibition voltage, and the ground select signal line GS2 may be driven by a fourth bipolar prohibition voltage.

FIG. 6 illustrates an example of selecting the word line WL1_2 of the first memory block 211. However, the same operation may also be performed in the case of selecting the other word lines WL1_1 and WL1_3~WL1_n of the first memory block 211, or in the case of performing a program operation on the second memory block 212.

FIG. 6 illustrates embodiments where two memory blocks 211 and 212 share the first block word line BLKWL1 connected to the block decoder 250. However, the same program operation may also be performed in embodiments where three or more memory blocks share the first block word line. As an example, when a program operation is performed on the memory blocks to be programmed among the memory blocks sharing the block word line, the bipolar prohibition voltages are applied to the program-inhibited memory blocks among the memory blocks sharing the block word line.

Figure 7:
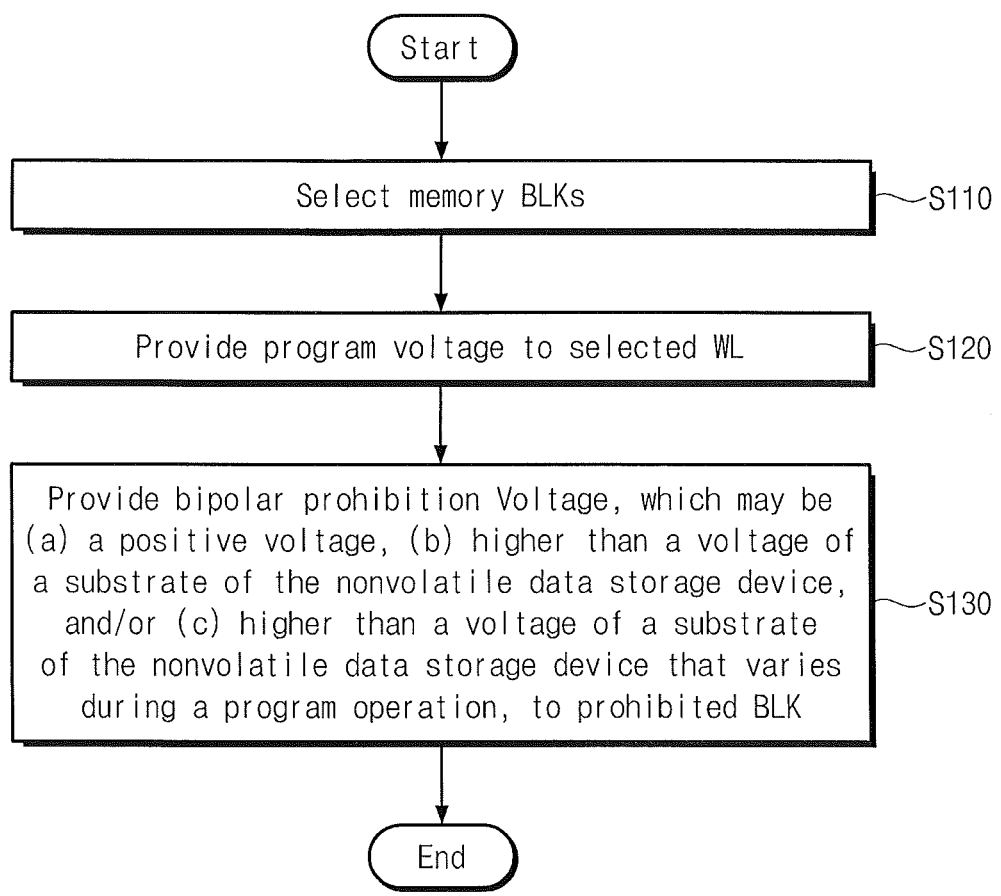
FIG. 7 is a flow chart illustrating a method of applying voltages to word lines of memory blocks sharing a block word line signal in a program operation.

FIG. 7 is a flow chart illustrating a method of applying voltages to the word lines of the memory blocks sharing a block word line signal in a program operation.

Referring to FIGS. 3, 6, and 7, in Block 5110 of FIG. 7, the block decoder 250 enables the pass transistor circuits 241 and 242. As an example, the block decoder 250 generates a block selection signal BLKWL1 to enable the pass transistors 241 and 242. Accordingly, the pass transistors 241 and 242 are turned on.

In Block 5120 of FIG. 7, the first driver 261 applies the program voltage Vpgm to a selected word line of the memory block to be programmed. The first driver 261 applies the pass voltage Vpass to an unselected word line of the memory block to be programmed. The first driver 261 applies the ground voltage VSS to a ground select line of the memory block to be programmed. The first driver 261 applies the power voltage VDD to a string select line of the memory block to be programmed.

In Block S130 of FIG. 7, the second driver 262 applies the bipolar prohibition voltage to the memory block to be program-inhibited. For example, the same bipolar prohibition voltage may be applied to the ground select signal line, the string select signal line, and the word line drive signal lines of the memory block to be program-inhibited. Alternatively, different bipolar prohibition voltages may be applied respectively to the ground select signal line, the string select signal line, and the word line drive signal lines. Additionally, the ground select signal line, the string select signal line, and the word line drive signal lines may be divided into a plurality of groups and different bipolar prohibition voltages may be applied on a group-by-group basis.

Figure 8:
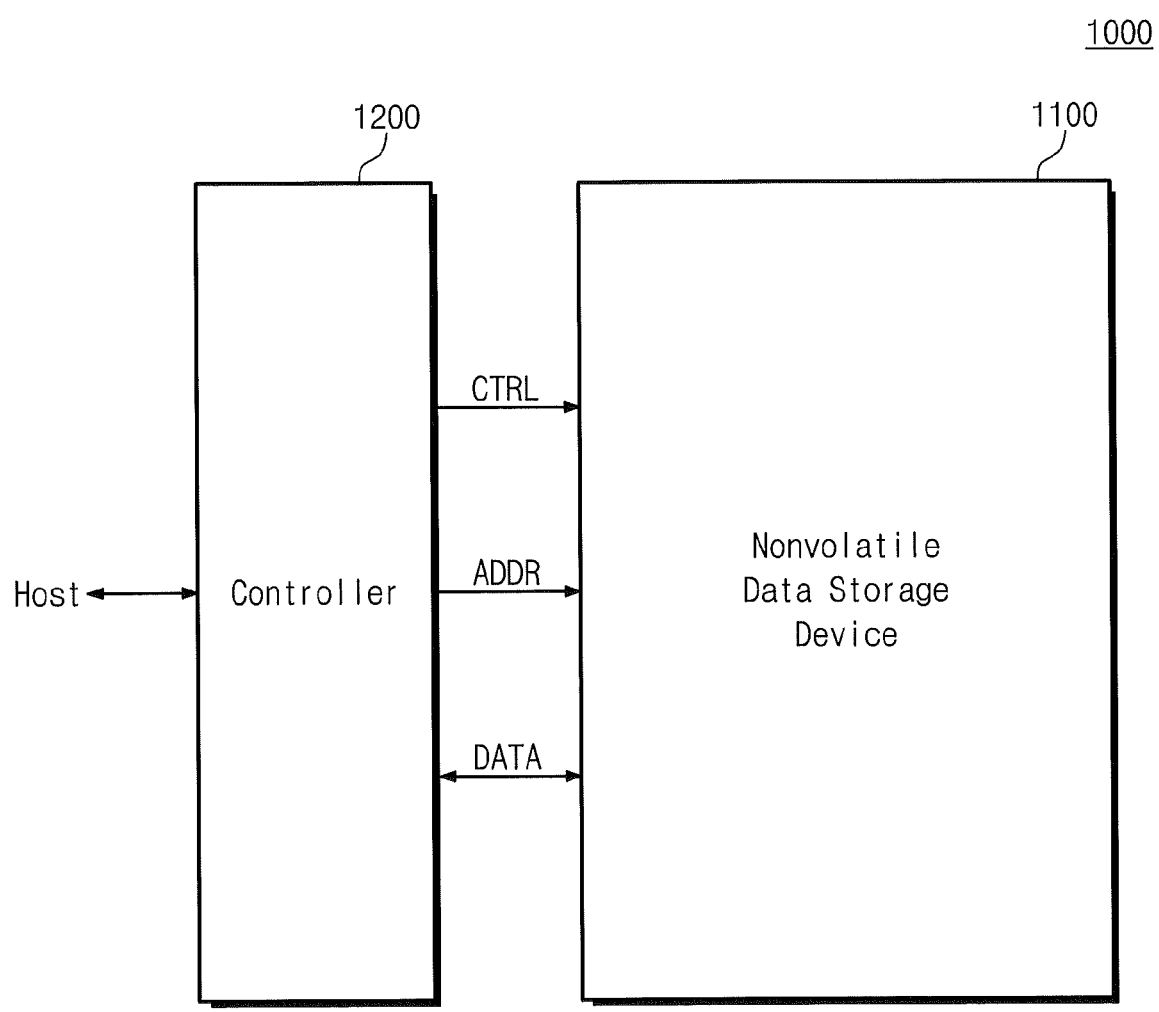
FIG. 8 is a block diagram of a memory system including the nonvolatile data storage device of FIG. 1 according to some embodiments.

FIG. 8 is a block diagram of a memory system 1000 including a nonvolatile data storage device 1100 according to some embodiments.

Referring to FIG. 8, the memory system 1000 includes a nonvolatile data storage device 1100 and a controller 1200.

The nonvolatile data storage device 1100 may be identical/similar to the nonvolatile data storage device 100 described with reference to FIG. 1.

The controller 1200 is connected to a host and the nonvolatile data storage device 1100. The controller 1200 is configured to access the nonvolatile data storage device 1100 in response to a request from the host. For example, the controller 1200 is configured to control a read/write/erase/background operation of the nonvolatile data storage device 1100. The controller 1200 is configured to provide an interface between the nonvolatile data storage device 1100 and the host. The controller 1200 is further configured to drive a firmware for controlling the nonvolatile data storage device 1100.

By way of example, referring to FIGS. 1 and 8, the controller 1200 is configured to provide a control signal CTRL and an address ADDR to the nonvolatile data storage device 1100. Also, the controller 1200 is configured to exchange data with the nonvolatile data storage device 1100.

As an example, the controller 1200 may include a random access memory (RAM), a processing unit, a host interface, and a memory interface. The RAM is used as at least one of a working memory of the processing unit, a cache memory between the nonvolatile data storage device 1100 and the host, and a buffer memory between the nonvolatile data storage device 1100 and the host. The processing unit controls an overall operation of the controller 1200.

The host interface includes protocol for data exchange between the host and the controller 1200. For example, the controller 1200 is configured to communicate with an external device (e.g., the host) through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, and IDE (Integrated Drive Electronics) protocol. The memory interface interfaces with the nonvolatile data storage device 1100. For example, the memory interface may include a NAND interface or a NOR interface.

The memory system 1000 may further include an error correction block. The error correction block uses an error correction code (ECC) to detect and correct an error in data read from the nonvolatile data storage device 1100. For example, the error correction block may be provided as a component of the controller 1200. Alternatively, the error correction block may be provided as a component of the nonvolatile data storage device 1100.

The controller 1200 and the nonvolatile data storage device 1100 may be integrated into one semiconductor device. For example, the controller 1200 and the nonvolatile data storage device 1100 may be integrated into one semiconductor device to constitute a memory card. The controller 1200 and the nonvolatile data storage device 1100 may be integrated into one semiconductor device to constitute a memory card such as a PC card (e.g., PCMCIA (Personal Computer Memory Card International Association)), a compact flash card (CF), a smart media card (e.g., SM and SMC), a memory stick, a multimedia card (e.g., MMC, RS-MMC, and MMCmicro), a secure digital (SD) card (e.g., SD, miniSD, microSD and SDHC), or a universal flash storage (UFS).

As another example, the controller 1200 and the nonvolatile data storage device 1100 may be integrated into one semiconductor device to constitute a solid state drive (SSD). For example, the SSD may include a storage device configured to store data in a semiconductor memory. When the memory system 1000 is used as an SSD, the operation speed of the host connected to the memory system 1000 may increase significantly.

As another example, the memory system 1000 may be provided for computers, UMPCs (Ultra Mobile PCs), work stations, net-books, PDAs (Personal Digital Assistants), portable computers, web tablets, wireless phones, mobile phones, smart phones, e-books, PMPs (Portable Multimedia Players), portable game devices, navigation devices, black boxes, digital cameras, DMB (Digital Multimedia Broadcasting) players, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, RFID devices, one of various components constituting a computing system, or one of various components of a electronic device.

As an example, the nonvolatile data storage device 1100 or the memory system 1000 may be mounted in various types of packages. Examples of the packages of the nonvolatile data storage device 1100 or the memory system 1000 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 9:
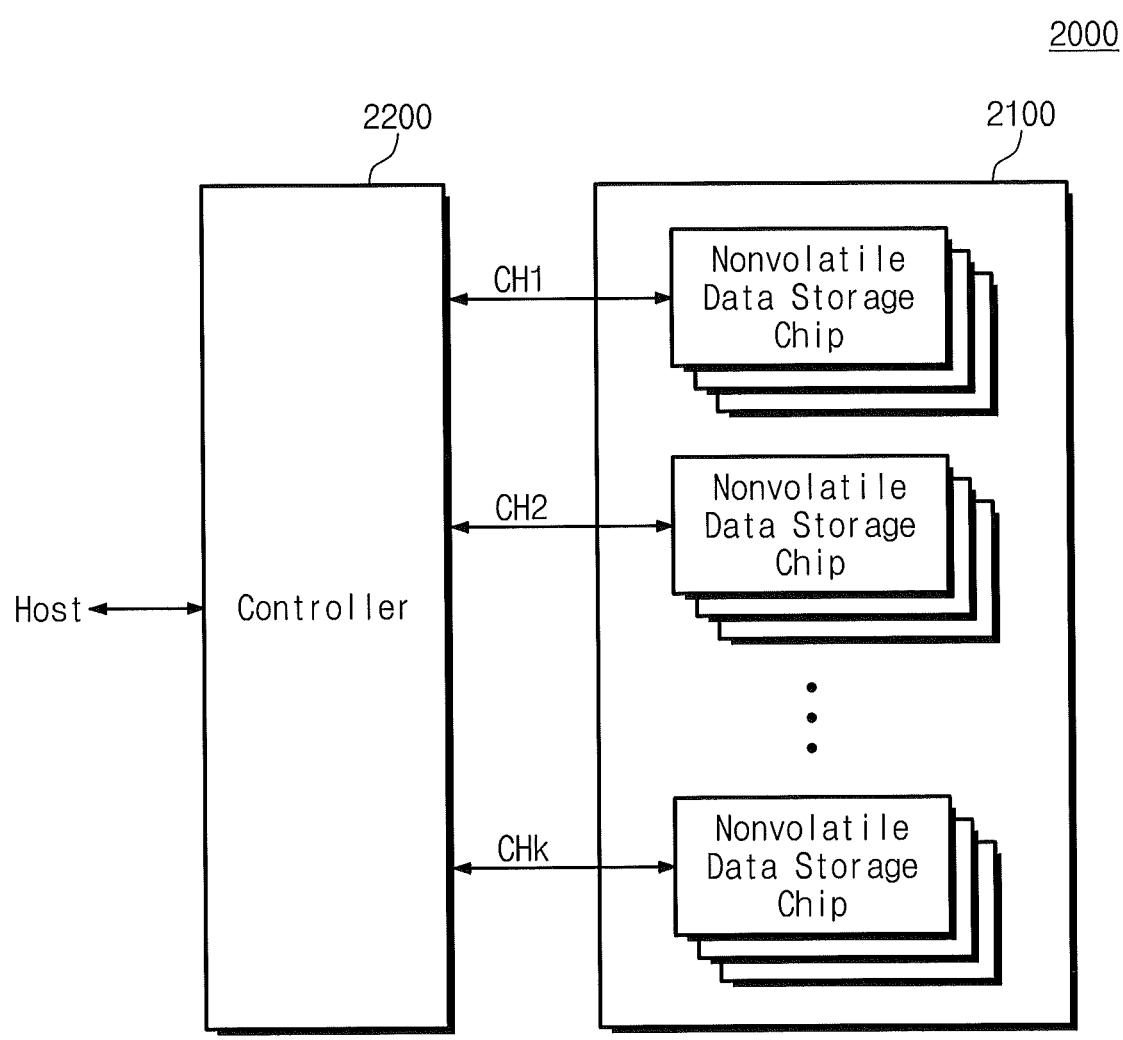
FIG. 9 is a block diagram illustrating an application of the memory system of FIG. 8 according to some embodiments.

FIG. 9 is a block diagram illustrating an application of the memory system 1000 of FIG. 8 according to some embodiments.

Referring to FIG. 9, a memory system 2000 includes a nonvolatile data storage device 2100 and a controller 2200.

The controller 2200 may be identical/similar to the memory controller 1200 described with reference to FIG. 8.

The nonvolatile data storage device 2100 includes a plurality of nonvolatile data storage chips. The nonvolatile data storage chips are divided into a plurality groups. Each group of the nonvolatile data storage chips is configured to communicate with the controller 2200 through a common channel. FIG. 9 illustrates that the nonvolatile data storage chips communicate with the controller 2200 through first to $k^{th}$ channels CH1~CHk. Each of the nonvolatile data storage chips may be configured in the same way as the nonvolatile data storage device 100 described with reference to FIG. 1. Also, the controller 2200 may be configured in the same way as the controller 1200 described with reference to FIG. 8.

Figure 10:
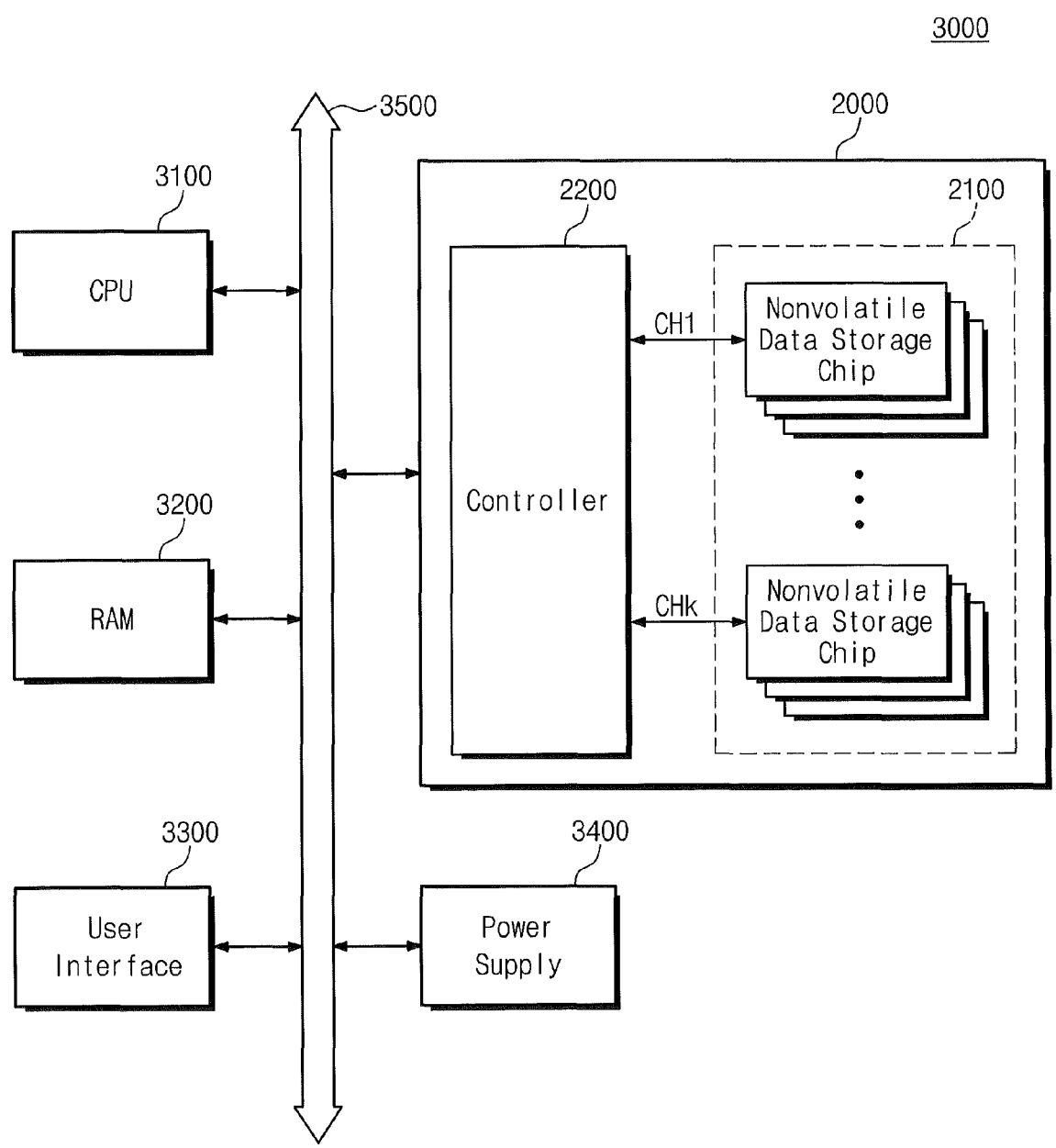
FIG. 10 is a block diagram of a computing system including the memory system described with reference to FIG. 9 according to some embodiments.

FIG. 10 is a block diagram of a computing system 3000 including the memory system 2000 described with reference to FIG. 9 according to some embodiments.

Referring to FIG. 10, the computing system 3000 includes a central processing unit (CPU) 3100, a random access memory (RAM) 3200, a user interface 3300, a power supply unit 3400, and a memory system 2000.

The memory system 2000 is electrically connected through a system bus 3500 to the CPU 3100, the RAM 3200, the user interface 3300, and the power supply unit 3400. Data, which are provided through the user interface 3300 or processed by the CPU 3100, are stored in the memory system 2000. The memory system 2000 includes a nonvolatile data storage device 2100 and a controller 2200.

FIG. 10 illustrates that the nonvolatile data storage device 2100 is connected through the controller 2200 to the system bus 3500. However, the nonvolatile data storage device 2100 may be connected directly to the system bus 3500 in some embodiments. In such embodiments, the function of the controller 1200/2200 of FIG. 8/9 may be performed by the CPU 3100.

FIG. 10 illustrates that the memory system 2000 of FIG. 9 is provided in the computing system 3000. However, the memory system 2000 may be replaced by, for example, the memory system 1000 of FIG. 8.

As another example, the computing system 3000 may be configured to include both of the memory systems 1000 and 2000 of FIGS. 8 and 9.

As described above, the method of programming the nonvolatile data storage device 100 according to some embodiments can reduce/prevent a bipolar phenomenon between the pass transistors S1G, S1W1~S1Wn, S1S, S2G, S2W1~S2Wn, and S2S of the first and second pass transistors 241 and 242. The methods of programming the nonvolatile data storage device according to some embodiments can reduce/prevent a bipolar phenomenon between the pass transistors of the transistor circuit, thus making it possible to improve the data reliability of the nonvolatile data storage device.

The above-disclosed subject matter is to be considered illustrative and not restrictive, and the appended claims are intended to cover all such modifications, enhancements, and other embodiments, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A nonvolatile data storage device comprising:
   first and second memory blocks sharing a block word line, the first memory block configured to be programmed and the second memory block configured to be program-inhibited;
   a block decoder connected to the block word line and configured to select the first and second memory blocks;
   a first driver configured to apply a program voltage to a selected word line among a plurality of word lines of the first memory block; and
   a second driver configured to apply a bipolar prohibition voltage to word lines of the second memory block,
   wherein the bipolar prohibition voltage is higher than a voltage of a substrate of the nonvolatile data storage device.

2. The nonvolatile data storage device of claim 1, further comprising:
   first pass transistors, each of the first pass transistors connected to a respective one of the plurality of word lines of the first memory block; and
   second pass transistors, each of the second pass transistors connected to a respective one of the word lines of the second memory block,
   wherein the block decoder is configured to enable the first pass transistors and the second pass transistors to select the first and second memory blocks.

3. The nonvolatile data storage device of claim 2, wherein the first driver is configured to apply the program voltage to the selected word line through a pass transistor among the enabled first pass transistors.

4. The nonvolatile data storage device of claim 2, wherein the second driver is configured to apply the bipolar prohibition voltage to the word lines of the second memory block through the enabled second pass transistors.

5. The nonvolatile data storage device of claim 1, wherein the second driver is configured to apply the bipolar prohibition voltage to a ground select line and a string select line of the second memory block.

6. A memory system comprising the nonvolatile data storage device of claim 1 and further comprising a controller configured to control the nonvolatile data storage device.

7. A method of programming a nonvolatile data storage device including memory blocks sharing a block word line, comprising:
   selecting the memory blocks, the selected memory blocks including a first memory block that is to be programmed and a second memory block that is to be program-inhibited;
   applying a program voltage to a selected word line of the first memory block; and
   applying a bipolar prohibition voltage to word lines of the second memory block,
   wherein the bipolar prohibition voltage is higher than a voltage of a substrate of the nonvolatile data storage device.

8. The method of claim 7, wherein selecting the memory blocks comprises enabling pass transistors connected to the selected memory blocks.

9. The method of claim 8, wherein applying the program voltage to the selected word line comprises applying the program voltage through one of the enabled pass transistors to the selected word line.

10. The method of claim 8, wherein applying the bipolar prohibition voltage to the word lines of the second memory block comprises applying the bipolar prohibition voltage through the enabled pass transistors to the word lines of the second memory block.

11. The method of claim 10, wherein applying the bipolar prohibition voltage to the word lines of the second memory block comprises applying a same bipolar prohibition voltage to each of the word lines of the second memory block.

12. The method of claim 10, wherein applying the bipolar prohibition voltage to the word lines of the second memory block comprises applying different bipolar prohibition voltages to different ones of the word lines of the second memory block.

13. The method of claim 10, wherein applying the bipolar prohibition voltage to the word lines of the second memory block comprises applying different bipolar prohibition voltages to different groups of the word lines of the second memory block.

14. The method of claim 7, wherein the bipolar prohibition voltage is a positive voltage.

15. The method of claim 7, wherein the bipolar prohibition voltage is higher than a voltage of a substrate of the nonvolatile data storage device that varies during a program operation.

16. The method of claim 7, further comprising applying the bipolar prohibition voltage to a ground select line and a string select line of the second memory block.

17. The method of claim 7, wherein a block decoder selects the first and second memory blocks in response to a decoded block address.

18. A method of operating a nonvolatile data storage device including memory blocks sharing a block word line, comprising:
   selecting the memory blocks to provide a first memory block that is to be programmed and a second memory block that is to be program-inhibited;
   enabling pass transistors connected to the first and second memory blocks to provide enabled pass transistors;
   applying a program voltage to a selected word line coupled to the first memory block,
   wherein a bipolar junction is formed from a portion of one of the enabled pass transistors through which the program voltage is applied and a portion of an immediately adjacent one of the enabled pass transistors connected to the second memory block; and applying a bipolar prohibition voltage through the enabled pass transistors to word lines coupled to the second memory block.

19. The nonvolatile data storage device of claim 2, further comprising a bipolar junction comprising a portion of one of the first pass transistors connected to the first memory block and a portion of an immediately adjacent one of the second pass transistors connected to the second memory block.

20. The method of claim 16, wherein applying the bipolar prohibition voltage to the ground select line, the string select line, and the word lines of the second memory block comprises applying different bipolar prohibition voltages to different groups of the ground select line, the string select line, and the word lines of the second memory block.

* * * * *